United States Patent
Soda (10) Patent No.: US 8,349,640 B2
(45) Date of Patent: Jan. 8, 2013

(54) METHOD OF MANUFACTURING SOLID-STATE IMAGE SENSOR

(75) Inventor: Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 133 days.

(21) Appl. No.: 13/096,703

(22) Filed: Apr. 28, 2011

(65) Prior Publication Data
US 2011/0294251 A1 Dec. 1, 2011

(30) Foreign Application Priority Data
May 28, 2010 (JP) .................................. 2010-123297

(51) Int. Cl.
*H01L 21/00* (2006.01)

(52) U.S. Cl. ............... 438/73; 438/57; 438/66; 438/67; 438/81; 257/E21.001; 257/E31.058

(58) Field of Classification Search .................... 438/73; 257/E21.001
See application file for complete search history.

(56) References Cited

U.S. PATENT DOCUMENTS
| | | | |
|---|---|---|---|
| 6,808,964 B2 * | 10/2004 | Hayashi et al. | 438/149 |
| 7,244,920 B2 | 7/2007 | Kim et al. | 250/208.1 |
| 7,687,299 B2 * | 3/2010 | Ichikawa | 438/57 |
| 2009/0283804 A1 * | 11/2009 | Masuoka et al. | 257/225 |
| 2009/0317936 A1 * | 12/2009 | Kanbe | 438/75 |
| 2010/0267184 A1 * | 10/2010 | Noh | 438/58 |

FOREIGN PATENT DOCUMENTS
| | | |
|---|---|---|
| JP | 2006-222427 A | 8/2006 |
| JP | 2008-60380 A | 3/2008 |

* cited by examiner

*Primary Examiner* — Angel Roman
(74) *Attorney, Agent, or Firm* — Fitzpatrick, Cella, Harper & Scinto (57) ABSTRACT

A method of manufacturing an image sensor having a plurality of pixels, each pixel having a photoelectric converter including an accumulation region, and a transfer gate, the accumulation region extending under a corresponding transfer gate, the plurality of pixels including a plurality of pixel groups, each pixel group including N adjacent pixels, and the channels of the N adjacent pixels, in each pixel group, being configured to transfer the charges of the N adjacent pixels away from each other, the method comprising a step of forming a resist pattern having one opening corresponding to each pixel group, and a step of forming a charge accumulation region for each of the N adjacent pixels by implanting ions into a substrate through the one opening of the resist pattern along N ion implantation directions so as to implant the ions under the transfer gate of each of the N adjacent pixels.

8 Claims, 8 Drawing Sheets

METHOD OF MANUFACTURING SOLID-STATE IMAGE SENSOR

BACKGROUND OF THE INVENTION

1. Field of the Invention

The present invention relates to a method of manufacturing a solid-state image sensor.

2. Description of the Related Art

Japanese Patent Laid-Open No. 2008-060380 discloses a method of manufacturing a solid-state image sensor having pixels each of which includes a MOS transistor including a channel region and a gate electrode, and a photodiode region in contact with the channel region under the gate electrode. Japanese Patent Laid-Open No. 2006-222427 discloses a sensor array including a plurality of pixels arranged in plane symmetry.

When the method of Japanese Patent Laid-Open No. 2008-060380 is applied to manufacture the sensor array described in Japanese Patent Laid-Open No. 2006-222427, ions are implanted from different directions to form the impurity regions of adjacent pixels. In this case, different resist patterns are normally formed in the respective ion implantation steps. However, if resist patterns are formed as many as the number of ion implantations required to form a photodiode region, the number of steps increases. In addition, the pixel characteristics vary due to alignment errors between the resist patterns.

SUMMARY OF THE INVENTION

The present invention provides a manufacturing method advantageous for simplifying the manufacture of a solid-state image sensor and/or reducing variations in pixel characteristics.

The first aspect of the present invention provides a method of manufacturing a solid-state image sensor in which a plurality of pixels are formed on a semiconductor substrate, each pixel having a photoelectric converter including an accumulation region where charges are accumulated, and a transfer gate forming a channel to transfer the charges accumulated in the accumulation region to a charge-voltage converter, the accumulation region extending under a corresponding transfer gate, the plurality of pixels being configured to include a plurality of pixel groups, each pixel group including N adjacent pixels (N is an integer of not less than 2), and the channels of the N adjacent pixels, in each pixel group, being configured to transfer the charges of the N adjacent pixels away from each other, the method comprising: a step of forming a resist pattern having one opening corresponding to each pixel group; and a step of forming a charge accumulation region for each of the N adjacent pixels by implanting ions into the semiconductor substrate through the one opening of the resist pattern along N ion implantation directions so as to implant the ions under the transfer gate of each of the N adjacent pixels.

The second aspect of the present invention provides a method of manufacturing a solid-state image sensor in which a first pixel and a second pixel are formed on a semiconductor substrate, the first pixel having a first semiconductor region of a first conductivity type and a first gate, the second pixel having a second semiconductor region of the first conductivity type and a second gate, the first semiconductor region and the second semiconductor region being arranged between the first gate and the second gate, and the first semiconductor region extending under the first gate, and the second semiconductor region extending under the second gate, the method comprising: a step of forming a resist pattern having one opening corresponding to the first pixel and the second pixel; a step of forming the first semiconductor region by implanting ions into the semiconductor substrate through the one opening of the resist pattern along a first ion implantation direction so as to implant the ions under the first gate; and a step of forming the second semiconductor region by implanting ions into the semiconductor substrate through the one opening of the resist pattern along a second ion implantation direction so as to implant the ions under the second gate.

Further features of the present invention will become apparent from the following description of exemplary embodiments with reference to the attached drawings.

DESCRIPTION OF THE EMBODIMENTS

A solid-state image sensor according to an embodiment of the present invention can include a pixel array including a plurality of pixels arranged two-dimensionally, a row selecting circuit which selects a row in the pixel array, a column selecting circuit which selects a column in the pixel array, and a readout circuit which reads out a signal from the pixel array via a column signal line. The pixel array, the row selecting circuit, the column selecting circuit, and the readout circuit are formed on a semiconductor substrate. Typically, the readout circuit reads out signals from the pixels of the row selected by the row selecting circuit in the pixel array. The column selecting circuit selects, from the signals of the pixels read out by the readout circuit, a signal to be externally output.

Each pixel includes a photoelectric converter including an accumulation region where charges are accumulated, and a transfer gate which forms a channel to transfer the charges accumulated in the accumulation region to a charge-voltage converter (floating diffusion). The charge-voltage converter may be shared by the plurality of pixels, or each pixel may have a charge-voltage converter. Each pixel or the plurality of pixels sharing the charge-voltage converter can include a reset switch which resets the voltage of the charge-voltage converter, and an amplifier unit which outputs a signal corresponding to the voltage of the charge-voltage converter to the column signal line.

Figure 1:
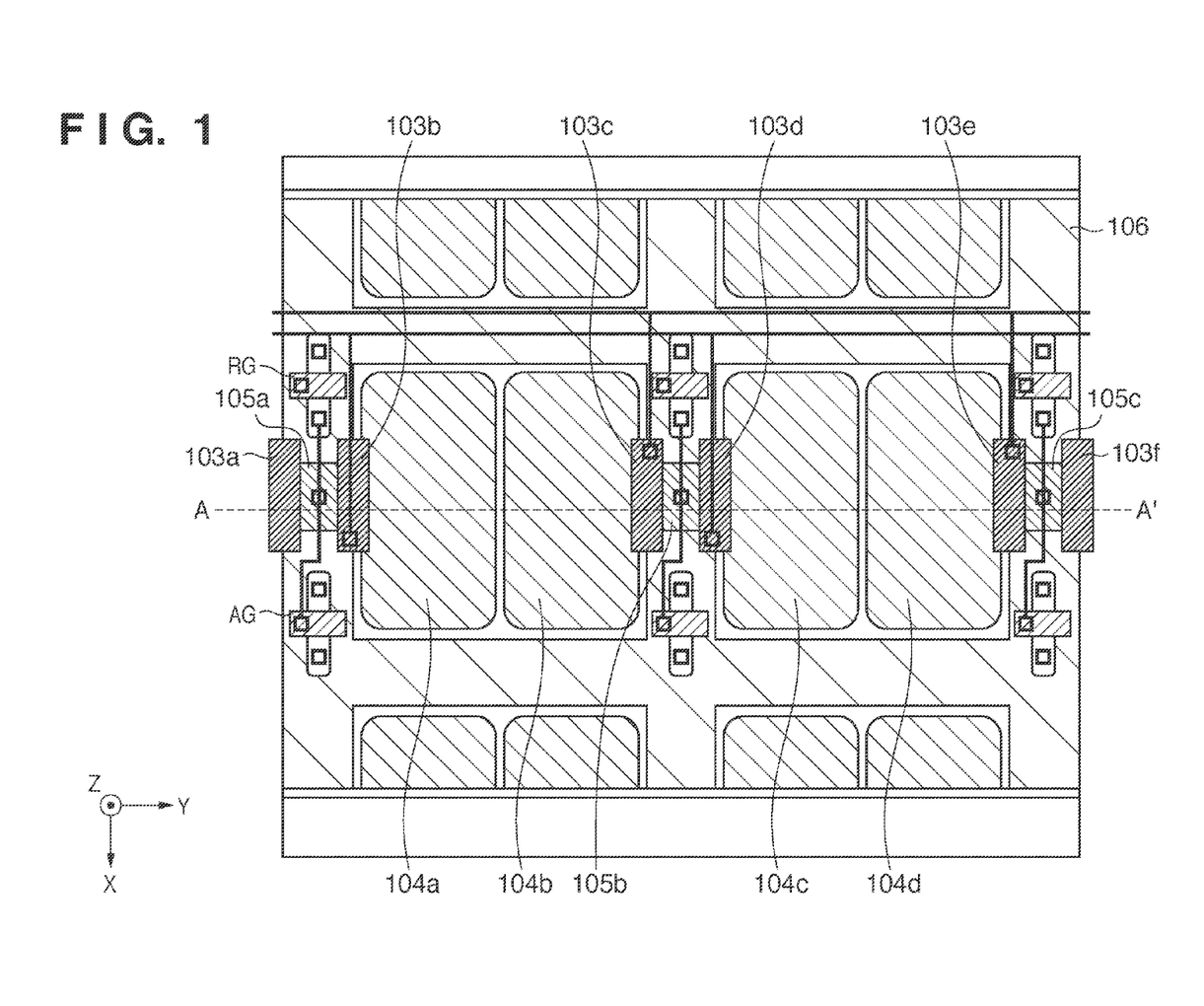
FIG. 1 is a plan view for explaining a solid-state image sensor according to the first embodiment of the present invention and a method of manufacturing the same.
Figure 2:
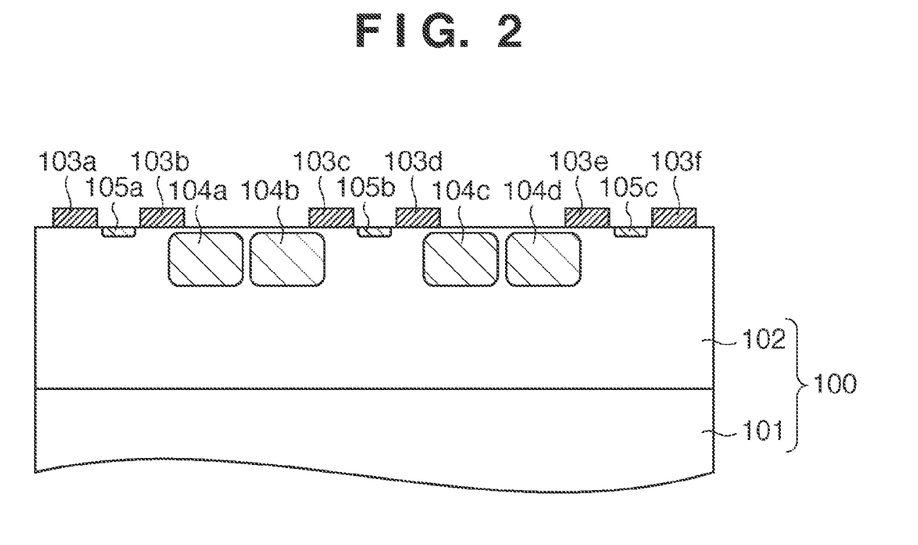
FIG. 2 is a sectional view for explaining the solid-state image sensor according to the first embodiment of the present invention and the method of manufacturing the same.

FIG. 1 is a plan view for explaining a solid-state image sensor according to the first embodiment of the present invention and a method of manufacturing the same. FIG. 2 is a sectional view taken along a line A-A' in FIG. 1. Note that referring to FIG. 1, after formation of transfer gates 103, a resist pattern 106 is formed on transfer gates 103. In the solid-state image sensor of the first embodiment, a plurality of pixels each of which includes a photoelectric converter including an accumulation region 104 where charges are accumulated, and the transfer gate 103 which forms a channel to transfer the charges accumulated in the accumulation region 104 to a charge-voltage converter 105 are formed on a semiconductor substrate 100. In FIGS. 1 and 2, the transfer gates 103 are distinguishably illustrated as transfer gates 103a to 103f, the accumulation regions 104 are distinguishably illustrated as accumulation regions 104a to 104f, and the charge-voltage converters 105 are distinguishably illustrated as charge-voltage converters 105a to 105c. In the example shown in FIGS. 1 and 2, two pixels share one charge-voltage converter, one reset switch, and one amplifier unit. The reset switch can be formed from a MOS transistor having a gate RG. The amplifier unit can be formed from a MOS transistor having a gate AG.

The semiconductor substrate 100 can include, for example, a semiconductor region 101 and a well region 102 arranged on it. The semiconductor region 101 can be a silicon substrate of the first conductivity type. The well region 102 (or impurity semiconductor region) can be of the second conductivity type. The accumulation regions 104 of the first conductivity type can be formed in the well region 102. The first conductivity type may be an n-type, and the second conductivity type may be a p-type. Alternatively, the first conductivity type may be a p-type, and the second conductivity type may be an n-type. An insulating film such as an oxide film is formed on the surface of the semiconductor substrate 100 (the surface of the well region 102). The transfer gates 103 are formed on the insulating film. When the first conductivity type is an n-type, and the second conductivity type is a p-type, electrons are accumulated in the accumulation regions 104. When the first conductivity type is a p-type, and the second conductivity type is an n-type, holes are accumulated in the accumulation regions 104.

The accumulation regions 104 extend under the transfer gates 103 in the well region 102. This makes it possible to suppress the voltage to be applied to the transfer gates 103 to transfer the charges in the accumulation regions 104 to the charge-voltage converters 105 and thus lower the power supply voltage. The upper surfaces of the accumulation regions 104 are preferably arranged at positions deeper than the surface of the semiconductor substrate 100 (the surface of the well region 102). A photoelectric converter having such a structure is called a buried type which can reduce noise induced by a dark current that can be generated at the interface between the insulating film (oxide film) and the surface of the semiconductor substrate 100.

In the example shown in FIGS. 1 and 2, a plurality of pixel groups each including two adjacent pixels are periodically arrayed. In this example, each pixel group includes two accumulation regions 104 (for example, the accumulation regions 104a and 104b) and two transfer gates 103 (for example, the transfer gates 103b and 103c). In each pixel group, the channels formed under the transfer gates 103 (for example, the transfer gates 103b and 103c) transfer charges in such transfer directions that move the charges away from each other. Two pixels (or two accumulation regions 104) included in each pixel group can typically be arranged in plane symmetry. Additionally, in the example shown in FIGS. 1 and 2, one pixel belonging to one pixel group and one pixel belonging to an adjacent pixel group share one charge-voltage converter, one reset switch, and one amplifier unit. This arrangement is advantageous for improving the pixel density.

In the example shown in FIG. 2, the common well region 102 and the accumulation regions 104 form photoelectric converters. Charges generated by a photoelectric converter are accumulated in the accumulation region 104 of the photoelectric converter. The transfer gate 103 functions as the gate of a MOS transistor. When the row selecting circuit supplies a voltage of active level to the transfer gates 103, the channel of the MOS transistor is formed under the transfer gate 103 so that the charges accumulated in the accumulation region 104 are transferred to the charge-voltage converter 105 via the channel.

A method of manufacturing the solid-state image sensor according to the first embodiment will be described below with reference to FIGS. 3A to 3C and 4A to 4C. A case in which the first conductivity type is an n-type, and the second conductivity type is a p-type will be described here to provide a more detailed example. However, the present invention is practicable even in the opposite case. First, in the step shown in FIG. 3A, an n-type semiconductor substrate is prepared, and boron is implanted into it. The semiconductor substrate 100 is thus obtained, which includes the p-type well region 102 arranged on the n-type semiconductor region 101. Next, in the step shown in FIG. 3B, an insulating film (oxide film) (not shown) is formed on the surface of the semiconductor substrate 100 (the surface of the well region 102). After that, a polysilicon film is formed on it. The polysilicon film is patterned to form the transfer gates 103.

Figure 3A:
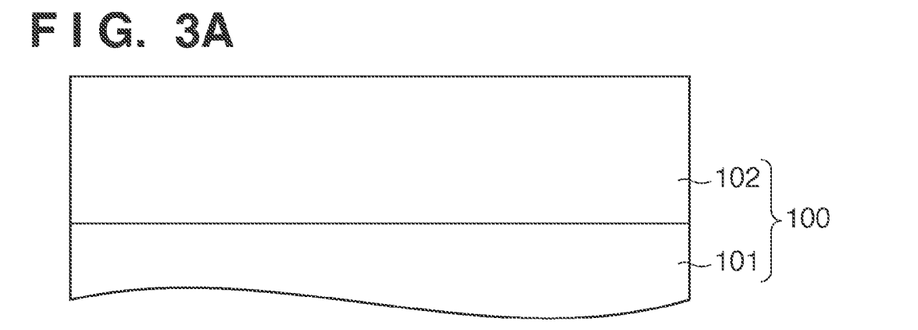
FIGS. 3A to 3C are sectional views for explaining the solid-state image sensor according to the first embodiment of the present invention and the method of manufacturing the same.
Figure 3B:
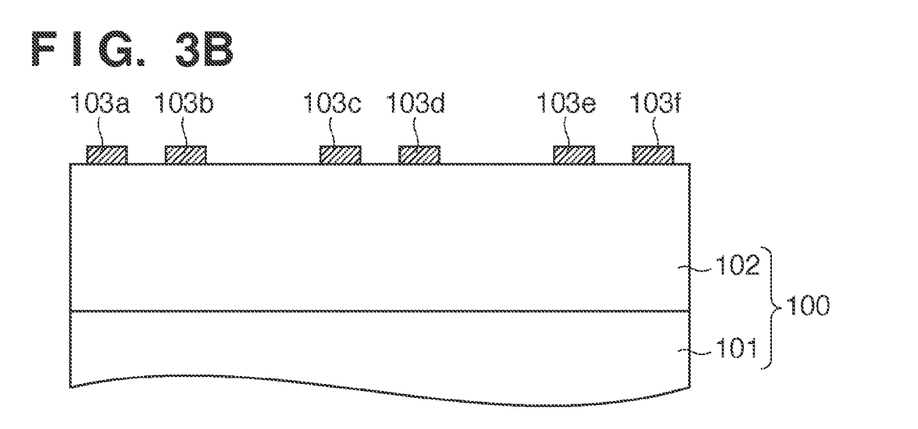
Figure 3C:
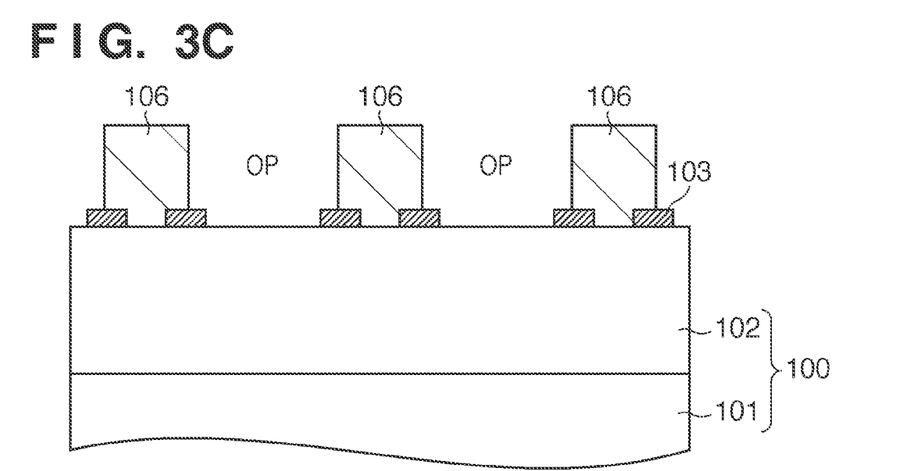

A resist pattern forming step shown in FIG. 3C is executed next. In the resist pattern forming step, photolithography is performed to form the resist pattern 106 on the semiconductor substrate 100 with the transfer gates 103. The resist pattern 106 has one opening OP in correspondence with each pixel group. Referring to FIG. 3C, each opening OP has an area corresponding to accumulation regions for two pixels. In the first embodiment, each pixel group includes two adjacent pixels. Each pixel group is configured to make channels formed under the two transfer gates 103 transfer charges in such transfer directions that move the charges away from each other.

Figure 4A:
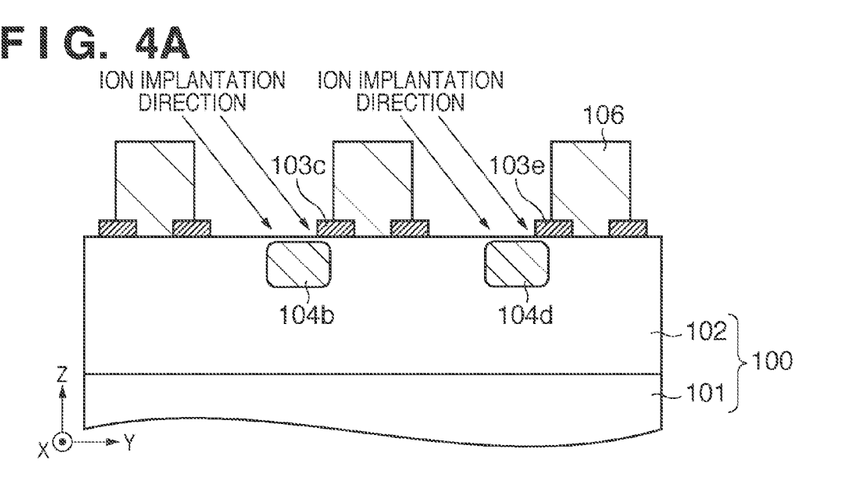
FIGS. 4A to 4C are sectional views for explaining the solid-state image sensor according to the first embodiment of the present invention and the method of manufacturing the same.
Figure 4B:
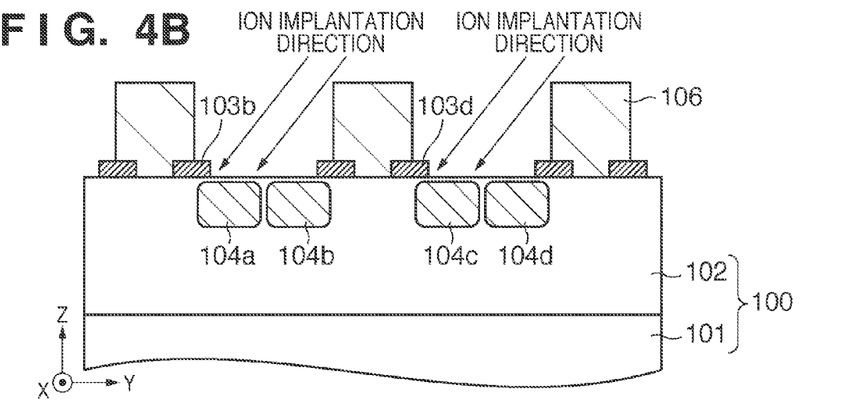

An accumulation region forming step shown in FIGS. 4A and 4B is executed next. In the step shown in FIG. 4A, ions (for example, arsenic or phosphorus ions) are implanted, through the openings OP of the resist pattern 106 in an ion implantation direction for implanting the ions under the transfer gates 103, into regions where the accumulation regions (in this case, the accumulation regions 104b and 104d) each corresponding to one pixel selected from the two pixels of each pixel group should be formed. Next, in the step shown in FIG. 4B, ions (for example, arsenic or phosphorus ions) are implanted, through the openings OP of the resist pattern 106 in an ion implantation direction for implanting the ions under the transfer gates 103, into regions where the accumulation regions (in this case, the accumulation regions 104a and 104c) each corresponding to the other pixel selected from the two pixels of each pixel group should be formed. That is, two implantation steps are executed using the resist pattern 106 so as to form all accumulation regions 104 of the two pixels of each pixel group. In each of the two implantation steps, the ion implantation direction is set to implant the ions under the transfer gate 103 of a corresponding one of the two pixels of each pixel group.

A component of the ion implantation direction of the implantation step shown in FIG. 4A in the direction (+Y direction) along the surface of the semiconductor substrate 100 can be opposite to a component of the ion implantation direction of the implantation step shown in FIG. 4B in the direction (−Y direction) along the surface of the semiconductor substrate 100. In addition, the ion implantation direction in the implantation step shown in FIG. 4A and that in the implantation step shown in FIG. 4B can have a plane symmetry relationship when defining a plane parallel to the X-Z plane in FIGS. 4A and 4B as a plane of symmetry. The two transfer gates 103 of one pixel group can be plane-symmetrical with respect to the plane of symmetry. It is possible to reduce the characteristic variations between the pixels by making the ion implantation directions in the two implantation steps plane-symmetrical with respect to the plane of symmetry and also making the two transfer gates 103 of one pixel group plane-symmetrical with respect to the plane of symmetry. In addition, using the common resist pattern 106 in the two implantation steps allows a reduction in the number of resist pattern forming steps and peeling steps and also provides a solution to the problem of characteristic variations between the pixels caused by alignment errors between resist patterns.

Note that in ion implantation (to be referred to as oblique ion implantation hereinafter) in which the ion implantation direction is tilted with respect to the normal to the surface of the semiconductor substrate, it is difficult to implant ions into regions behind the resist pattern. Hence, performing oblique ion implantation using a resist pattern having an opening for each pixel may limit the area of the accumulation region of the photoelectric converter and decrease the saturated charge amount. On the other hand, according to the first embodiment, one opening is formed in correspondence with each pixel group including two pixels, and oblique ion implantation is performed through the opening. This allows an increase in the area of the accumulation region of the photoelectric converter and an improvement in the saturated charge amount.

The above-described two implantation steps may be executed simultaneously. For this purpose, for example, an ion implantation apparatus having two ion implantation systems each including an ion source that generates ions, a beam line that transports the ions, and an accelerating tube that accelerates the ions is prepared.

Figure 4C:
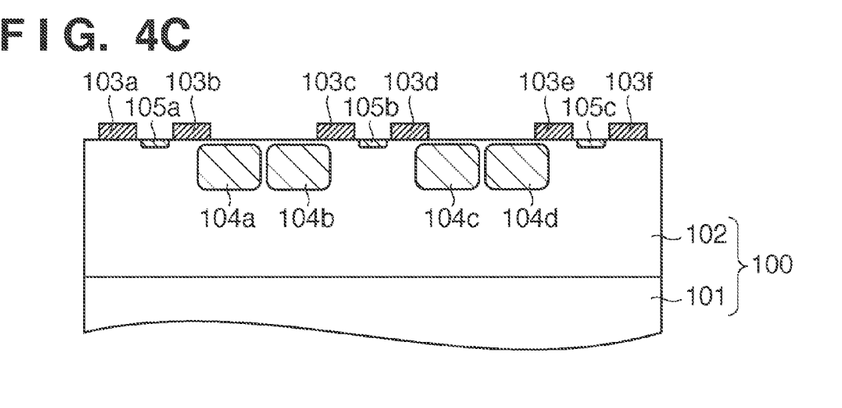

Next, in the step shown in FIG. 4C, a resist pattern is formed on the semiconductor substrate 100 with the accumulation regions 104, and ions are implanted into the semiconductor substrate 100 (well region 102) through the openings of the resist pattern. The charge-voltage converters 105 of the first conductivity type are thus formed. Note that the implantation steps shown in FIGS. 4A, 4B, and 4C may be accompanied by an annealing step.

Figure 5:
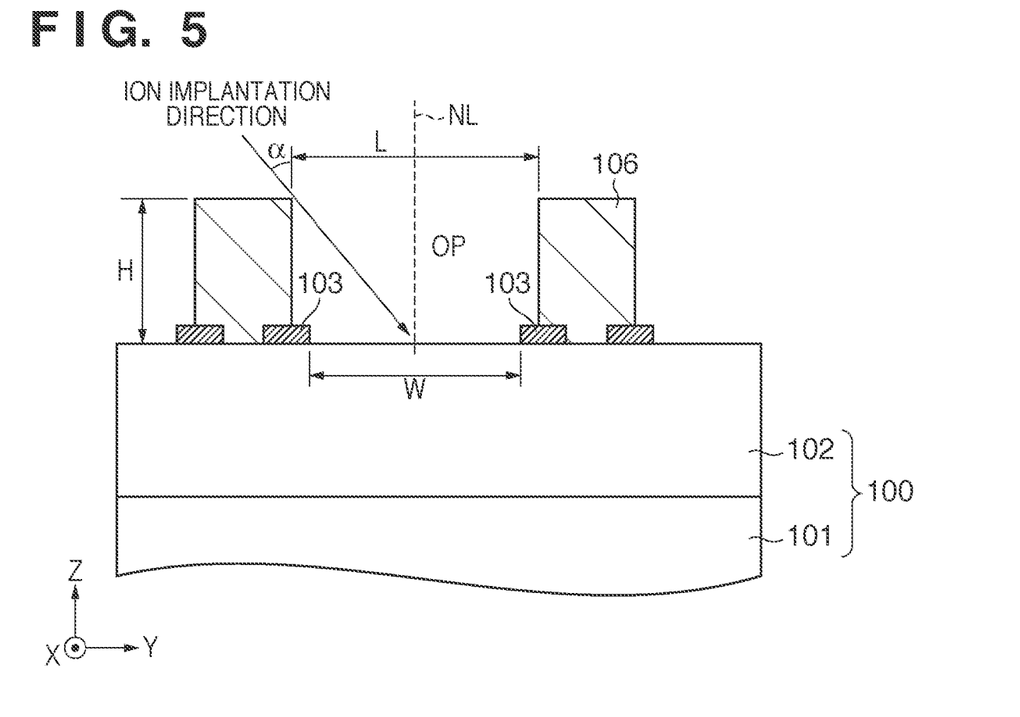
FIG. 5 is a view for explaining desirable conditions in the implantation steps.

Desirable conditions in the implantation steps shown in FIGS. 4A and 4B will be described below. As shown in FIG. 5, the direction along the gate width of the transfer gate 103 is defined as the X-axis, the direction along the gate length of the transfer gate 103 as the Y-axis, a normal NL to the surface of the semiconductor substrate 100 as the Z-axis, and the angle (implantation angle) made by the X-Z plane and the ion implantation direction upon forming the accumulation regions 104 as α. Let H be the height of the resist pattern 106, L be the Y-axis width of the opening of the resist pattern 106, and W be the distance between the two transfer gates 103 exposed to the opening OP of the resist pattern 106. At this time, $$L/2 < H \cdot \tan \alpha < (L+W)/2 \quad (1)$$

is preferably satisfied. When the condition $H \cdot \tan \alpha < (L+W)/2$ of inequality (1) is satisfied, at least some of the ions that irradiate the semiconductor substrate 100 can reach the semiconductor substrate 100; that is, the accumulation regions 104 can be formed. When the inequality $L/2 < H \cdot \tan \alpha$ (1) is satisfied, the ion implantation regions between adjacent pixels, which have the plane symmetry, can spatially be separated. To satisfy inequality (1), all or some of the resist pattern height H, the opening width L, the implantation angle α, and the distance W between the transfer gates 103 are adjusted for the pixels.

Note that the first embodiment is applicable not only when two pixels are arranged in plane symmetry but also when charges are transferred in such transfer directions (for example, opposite directions) that move the charges away from each other.

Figure 6:
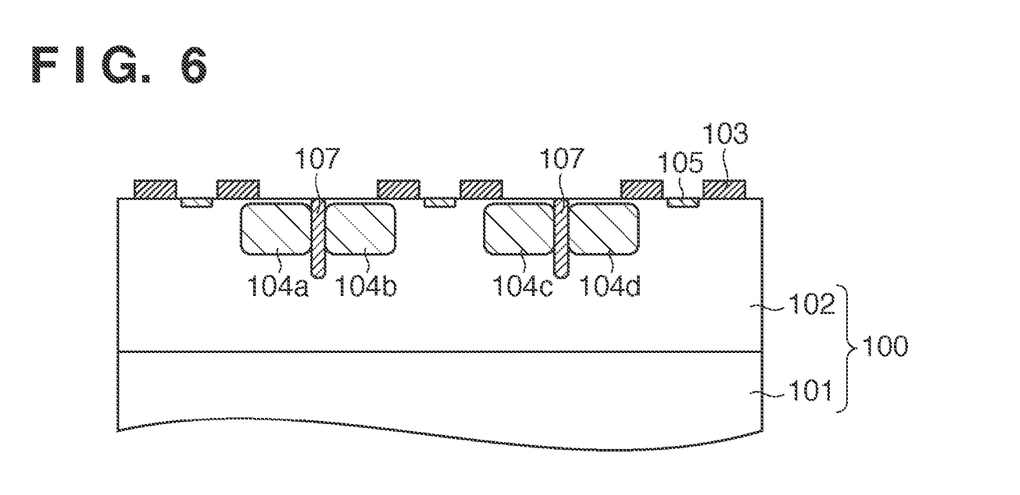
FIG. 6 is a sectional view for explaining a solid-state image sensor according to the second embodiment of the present invention and a method of manufacturing the same.

A solid-state image sensor according to the second embodiment of the present invention and a method of manufacturing the same will be described with reference to FIG. 6. Note that particulars that are not mentioned in the second embodiment can comply with the first embodiment. The manufacturing method of the second embodiment includes a step of forming semiconductor regions 107 each of which isolates accumulation regions 104 (for example, accumulation regions 104a and 104b) of two pixels (in other words, two pixels included in one pixel group) formed through one opening of a photoresist 106 described above. The semiconductor regions 107 have a conductivity type (second conductivity type) opposite to that (first conductivity type) of the accumulation regions 104. The semiconductor regions 107 contribute to color mixture prevention and sensitivity improvement. The semiconductor regions 107 are useful especially when the two accumulation regions 104 formed by ion implantation executed in different ion implantation directions overlap each other, or the two accumulation regions 104 overlap each other due to ion diffusion. In the second embodiment, for example, even if a height H of the resist pattern 106 does not satisfy inequality (1), the two adjacent accumulation regions 104 can be isolated from each other.

Figure 7:
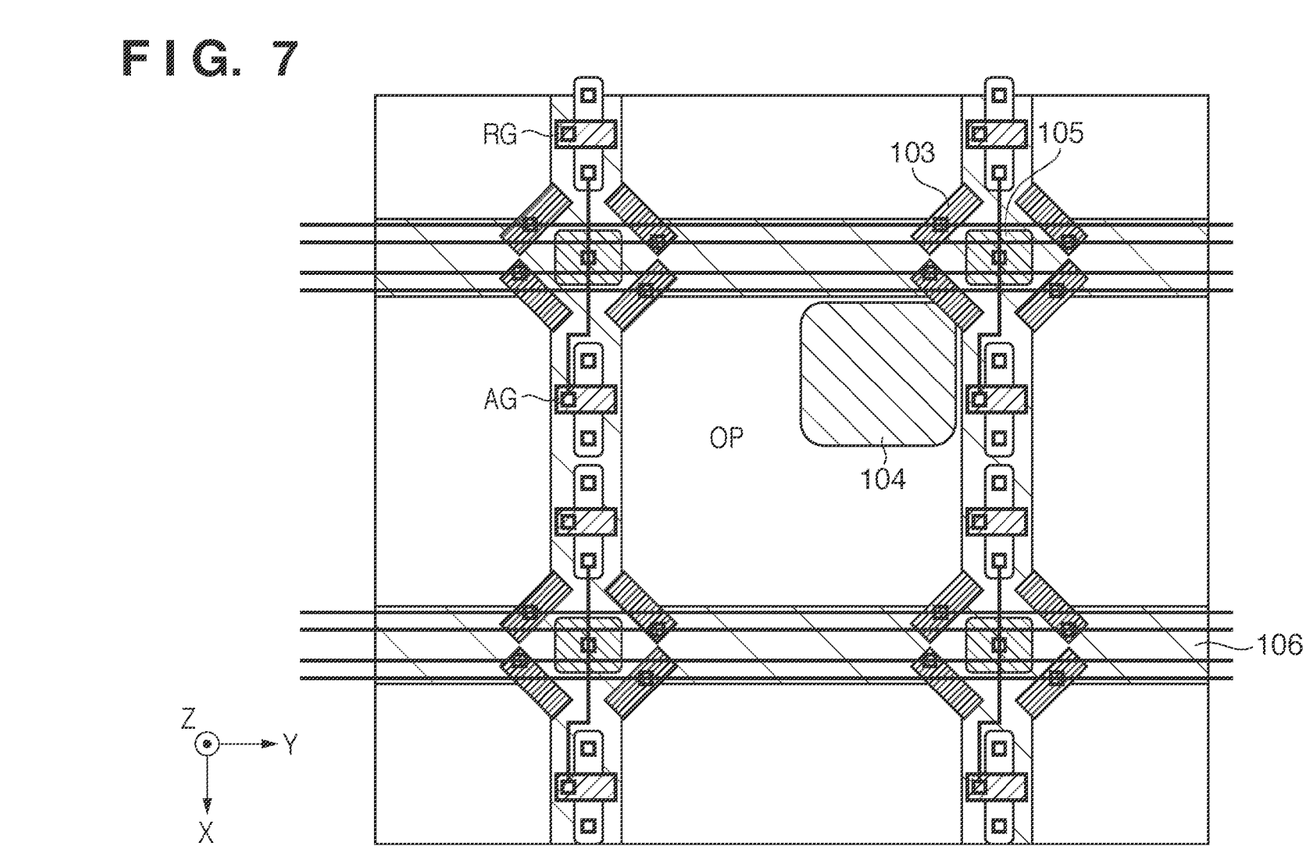
FIG. 7 is a plan view for explaining a solid-state image sensor according to the third embodiment of the present invention and a method of manufacturing the same.

A solid-state image sensor according to the third embodiment of the present invention and a method of manufacturing the same will be described with reference to FIGS. 7 to 9. Note that particulars that are not mentioned in the third embodiment can comply with the first or second embodiment. In the third embodiment, one opening OP of a resist pattern 106 has an area corresponding to accumulation regions 104 of four pixels. In the third embodiment, each pixel group includes four adjacent pixels. Each pixel group is configured to form channels under four transfer gates 103 that transfer charges in such transfer directions that move the charges away from each other. In the example shown in FIG. 7, the plane symmetry of four pixels included in one pixel group is ensured with respect to a plane of symmetry along the X-axis and a plane of symmetry along the Y-axis. In the third embodiment, ion implantation directions that cross not only the X-Z plane but also the Y-Z plane are selectable.

Figure 8:
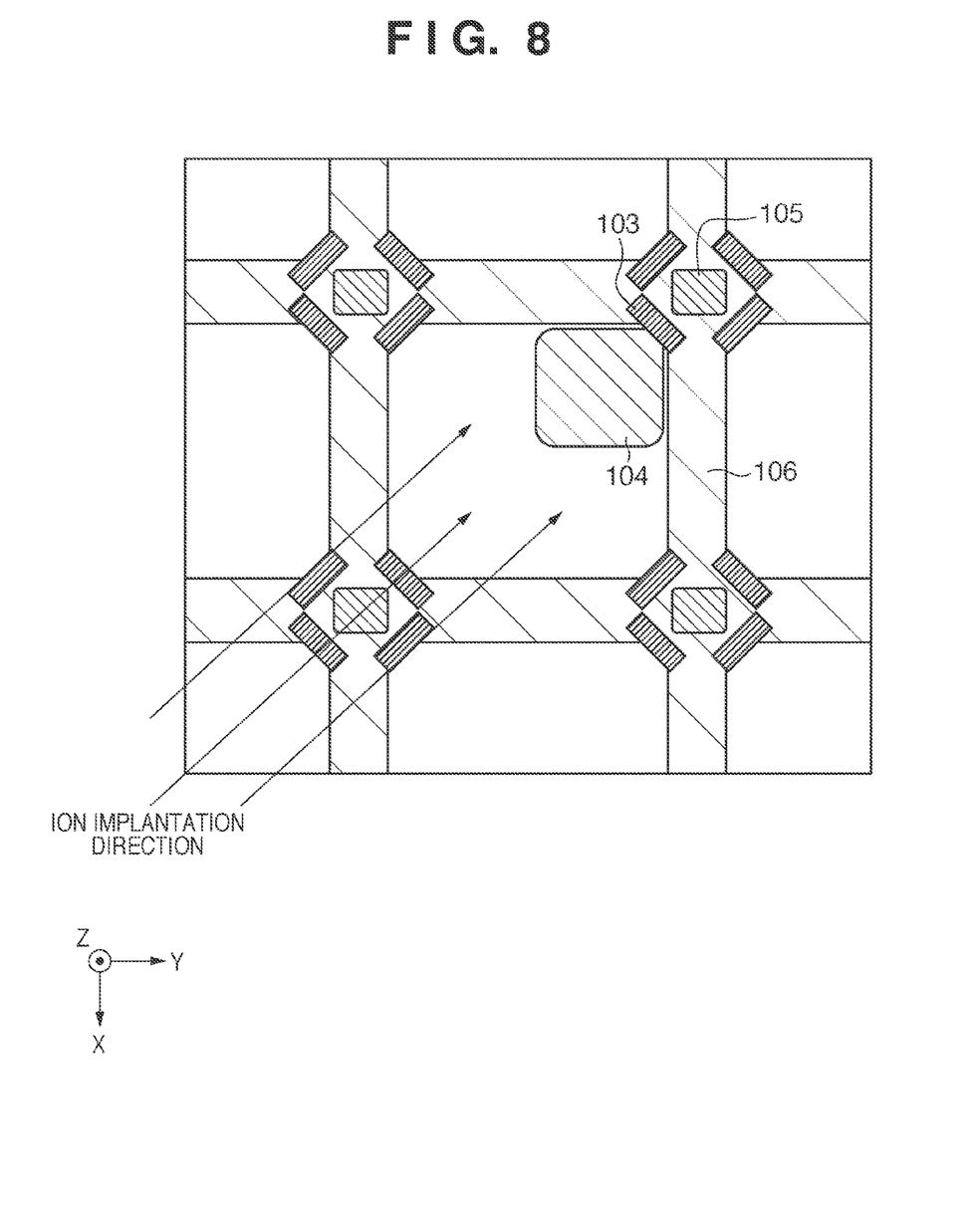
FIG. 8 is a plan view for explaining the solid-state image sensor according to the third embodiment of the present invention and the method of manufacturing the same.

For example, when the transfer gates 103 extend obliquely with respect to the pixel array direction, as illustrated in FIG. 8, the ion implantation directions can be set so as to cross both the X-Z plane and the Y-Z plane. In this case as well, the accumulation regions 104 or the photoelectric converters can be extended under the transfer gates 103, and the charge transfer performance can be improved. In the example shown in FIG. 8, ions are implanted into the semiconductor substrate in four ion implantation directions through one opening of one resist pattern 106, thereby forming the accumulation regions 104 of four pixels included in one pixel group. Ion implantation in the four ion implantation directions is typically done in four ion implantation steps.

Figure 9:
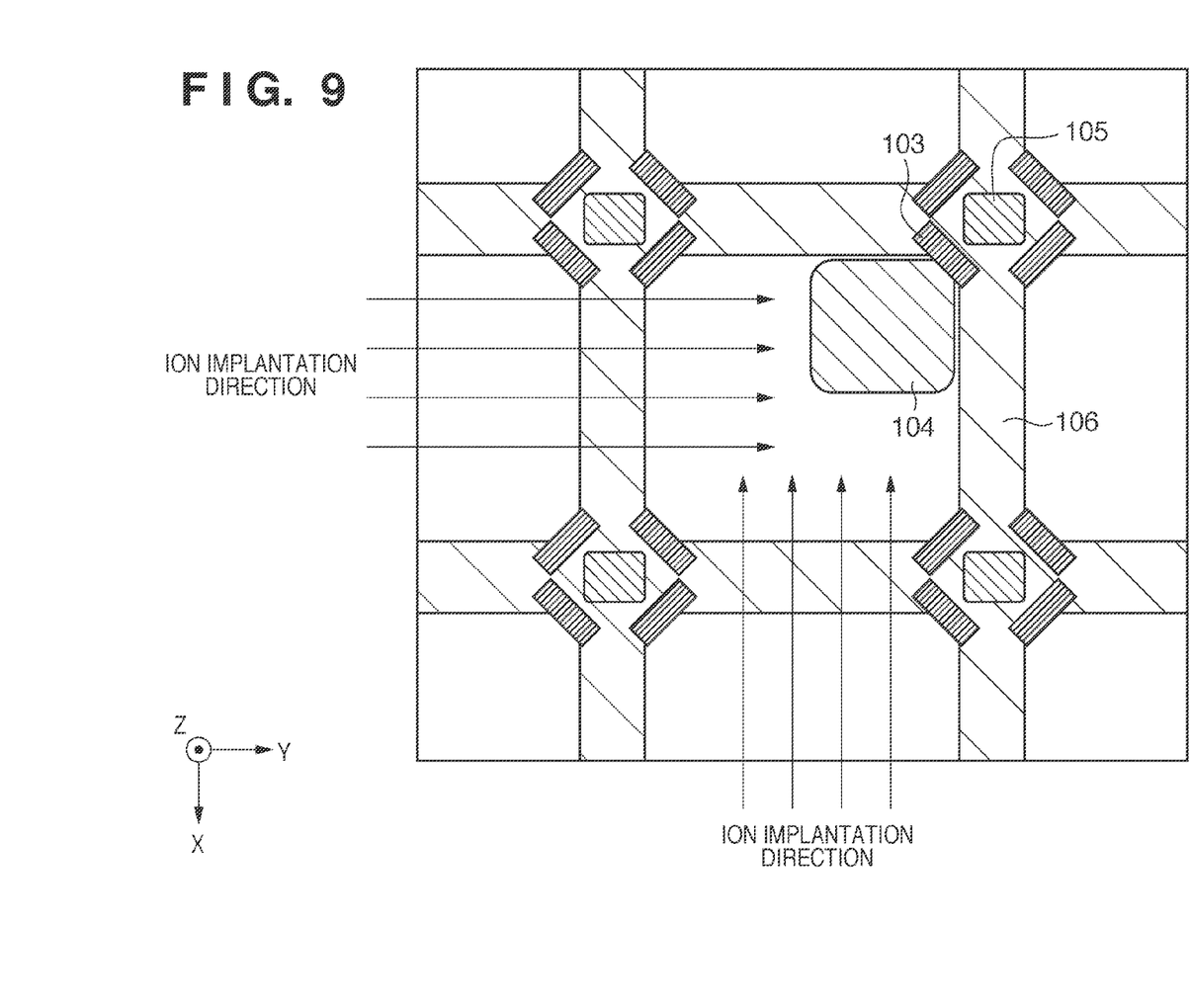
FIG. 9 is a plan view for explaining the solid-state image sensor according to the third embodiment of the present invention and the method of manufacturing the same.

Instead of determining the ion implantation directions that cross both the X-Z plane and the Y-Z plane, an ion implantation direction parallel to the X-axis and that parallel to the Y-axis may separately be set, as schematically shown in FIG. 9. In this case, the impurity concentration becomes high in a region where ions are implanted in both the ion implantation direction parallel to the X-axis and that parallel to the Y-axis. In this embodiment, semiconductor regions like the semiconductor regions 107 for separation in the second embodiment are preferably formed to isolate the four accumulation regions 104 from each other.

The present invention is also applicable when channels formed under the transfer gates 103 of each pixel group including N (N is a natural number of 2 or more) adjacent pixels transfer charges in such transfer directions that move the charges away from each other. In this case, in each implantation step, ions are implanted, through each opening OP of the resist pattern 106 in an ion implantation direction for implanting the ions under the transfer gates 103, into a region where the transfer gate 103 of one pixel selected from the N pixels of each pixel group should be formed. Such an implantation step is executed N times while changing the ion implantation direction in accordance with the selected pixel (that is, the pixel for which the accumulation region should be formed) so as to form all accumulation regions 104 of the N pixels of each pixel group. Note that the first to third embodiments use examples in which N is an even number. However, N may be an odd number. If N is an odd number, the layout efficiency may be poorer.

In the first to third embodiments, a plurality of pixels share one charge-voltage converter, one reset switch, and one amplifier unit. The present invention is not limited to this example. One charge-voltage converter, one reset switch, and one amplifier unit may be arranged for each pixel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-123297, filed May 28, 2010, which is hereby incorporated by reference herein in its entirety.

What is claimed is:

1. A method of manufacturing a solid-state image sensor in which a plurality of pixels are formed on a semiconductor substrate,
    each pixel having a photoelectric converter including an accumulation region where charges are accumulated, and a transfer gate forming a channel to transfer the charges accumulated in the accumulation region to a charge-voltage converter,
    the accumulation region extending under a corresponding transfer gate,
    the plurality of pixels being configured to include a plurality of pixel groups, each pixel group including N adjacent pixels (N is an integer of not less than 2), and
    the channels of the N adjacent pixels, in each pixel group, being configured to transfer the charges of the N adjacent pixels away from each other, the method comprising:
    a step of forming a resist pattern having one opening corresponding to each pixel group; and
    a step of forming a charge accumulation region for each of the N adjacent pixels by implanting ions into the semiconductor substrate through the one opening of the resist pattern along N ion implantation directions so as to implant the ions under the transfer gate of each of the N adjacent pixels.

2. The method according to claim 1, wherein in the step of forming the accumulation region, the ions are implanted into the semiconductor substrate N times while changing the ion implantation direction so as to implant the ions into the semiconductor substrate in each of the N ion implantation directions.

3. The method according to claim 1, wherein when a direction along a gate width of the transfer gate is defined as an X-axis, a direction along a gate length of the transfer gate as a Y-axis, a normal to a surface of the semiconductor substrate as a Z-axis, an angle made by an X-Z plane and the ion implantation direction as α, a height of the resist pattern as H, a Y-axis width of the one opening of the resist pattern as L, and a distance between the two transfer gates exposed to the one opening of the resist pattern as W, $$L/2 < H \cdot \tan \alpha < (L+W)/2$$

is satisfied.

4. The method according to claim 1, further comprising a step of forming a semiconductor region which isolates the accumulation regions of the N adjacent pixels of each pixel group from each other.

5. The method according to claim 1, wherein N=2 or 4.

6. The method according to claim 1, wherein the pixels included in each pixel group have planar symmetry to each other.

7. A method of manufacturing a solid-state image sensor in which a first pixel and a second pixel are formed on a semiconductor substrate,
    the first pixel having a first semiconductor region of a first conductivity type and a first gate,
    the second pixel having a second semiconductor region of the first conductivity type and a second gate,
    the first semiconductor region and the second semiconductor region being arranged between the first gate and the second gate, and
    the first semiconductor region extending under the first gate, and the second semiconductor region extending under the second gate, the method comprising:
    a step of forming a resist pattern having one opening corresponding to the first pixel and the second pixel;
    a step of forming the first semiconductor region by implanting ions into the semiconductor substrate through the one opening of the resist pattern along a first ion implantation direction so as to implant the ions under the first gate; and
    a step of forming the second semiconductor region by implanting ions into the semiconductor substrate through the one opening of the resist pattern along a second ion implantation direction so as to implant the ions under the second gate.

8. The method according to claim 7, further comprising a step of forming a third semiconductor region of a second conductivity type between the first semiconductor region and the second semiconductor region.

* * * * *